US010261578B2

(12) United States Patent
Shpunt et al.

(10) Patent No.: US 10,261,578 B2
(45) Date of Patent: Apr. 16, 2019

(54) SCANNING DEPTH ENGINE

(71) Applicant: APPLE INC., Cupertino, CA (US)

(72) Inventors: Alexander Shpunt, Portola Valley, CA (US); Raviv Erlich, Kibbutz Beit Nir (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/844,651

(22) Filed: Dec. 18, 2017

(65) Prior Publication Data

US 2018/0120931 A1 May 3, 2018

Related U.S. Application Data

(63) Continuation of application No. 15/473,653, filed on Mar. 30, 2017, now Pat. No. 9,898,074, which is a
(Continued)

(51) Int. Cl.
*G01C 3/08* (2006.01)
*G06F 3/01* (2006.01)
(Continued)

(52) U.S. Cl.
CPC .............. *G06F 3/011* (2013.01); *B23P 19/04* (2013.01); *G01J 1/0411* (2013.01); *G01J 1/44* (2013.01);
(Continued)

(58) Field of Classification Search
CPC ...... G06F 3/011; G01S 7/4817; G01S 7/4865; G01S 7/4868; G01S 17/42; G01S 17/89; G01S 7/4812; G01S 17/10; B23P 19/04; G01J 1/0411; G01J 1/44; G01J 2001/4466; G02B 27/0961; G06T 15/00; Y10T 29/49002; H01S 5/02296; H01S 3/0071; H01S 5/02248; H01S 5/02288; H01S 5/4012; H01S 5/4075; H01S 5/423
See application file for complete search history.

(56) References Cited

U.S. PATENT DOCUMENTS 4,713,544 A * 12/1987 Grage ..................... F41G 3/065
                                                                250/334
7,949,024 B2    5/2011 Joseph
(Continued)

FOREIGN PATENT DOCUMENTS

JP       2006310417 A    11/2006

OTHER PUBLICATIONS

JP Application # 2016-152724 office action dated Nov. 20, 2017.
U.S. Appl. No. 15/588,719 office action dated May 30, 2018.

*Primary Examiner* — Samantha K Abraham
(74) *Attorney, Agent, or Firm* — Kligler & Associates

(57) ABSTRACT

Mapping apparatus includes a transmitter, which is configured to emit at least one beam including a sequence of pulses of light toward a plurality of points in a scene. A receiver is configured to receive the light reflected from the scene and to generate an output indicative of a time of flight of the pulses to and from the points in the scene. A processor is coupled to process the output of the receiver so as to generate a 3D map of the scene, while controlling a power level of the pulses emitted by the transmitter responsively to a level of the output from the receiver in response to one or more previous pulses.

16 Claims, 14 Drawing Sheets

Related U.S. Application Data continuation of application No. 13/766,801, filed on Feb. 14, 2013, now Pat. No. 9,651,417.

(60) Provisional application No. 61/598,921, filed on Feb. 15, 2012.

(51) Int. Cl.
| | |
|---|---|
| *G01J 1/04* | (2006.01) |
| *H01S 3/00* | (2006.01) |
| *B23P 19/04* | (2006.01) |
| *G06T 15/00* | (2011.01) |
| *H01S 5/022* | (2006.01) |
| *H01S 5/40* | (2006.01) |
| *H01S 5/42* | (2006.01) |
| *G01S 17/10* | (2006.01) |
| *G01S 17/42* | (2006.01) |
| *G01S 17/89* | (2006.01) |
| *G01S 7/481* | (2006.01) |
| *G01S 7/486* | (2006.01) |
| *G01J 1/44* | (2006.01) |
| *G02B 27/09* | (2006.01) |

(52) U.S. Cl.
CPC .......... *G01S 7/4812* (2013.01); *G01S 7/4817* (2013.01); *G01S 7/4865* (2013.01); *G01S 7/4868* (2013.01); *G01S 17/10* (2013.01); *G01S 17/42* (2013.01); *G01S 17/89* (2013.01); *G02B 27/0961* (2013.01); *G06T 15/00* (2013.01); *H01S 3/0071* (2013.01); *H01S 5/02248* (2013.01); *H01S 5/02288* (2013.01); *H01S 5/4012* (2013.01); *H01S 5/4075* (2013.01); *H01S 5/423* (2013.01); *G01J 2001/4466* (2013.01); *H01S 5/02296* (2013.01); *Y10T 29/49002* (2015.01)

(56) References Cited

U.S. PATENT DOCUMENTS

| | | | | |
|---|---|---|---|---|
| 2003/0227614 | A1* | 12/2003 | Taminiau | B23K 26/04 356/125 |
| 2005/0046850 | A1* | 3/2005 | Chow | G01B 11/0625 356/430 |
| 2011/0106324 | A1* | 5/2011 | Tsadka | G01P 5/26 700/287 |
| 2011/0292406 | A1 | 12/2011 | Hollenbeck et al. | |
| 2011/0310125 | A1* | 12/2011 | McEldowney | G06F 3/017 345/660 |
| 2013/0107000 | A1* | 5/2013 | Xue | G01S 17/023 348/46 |

\* cited by examiner

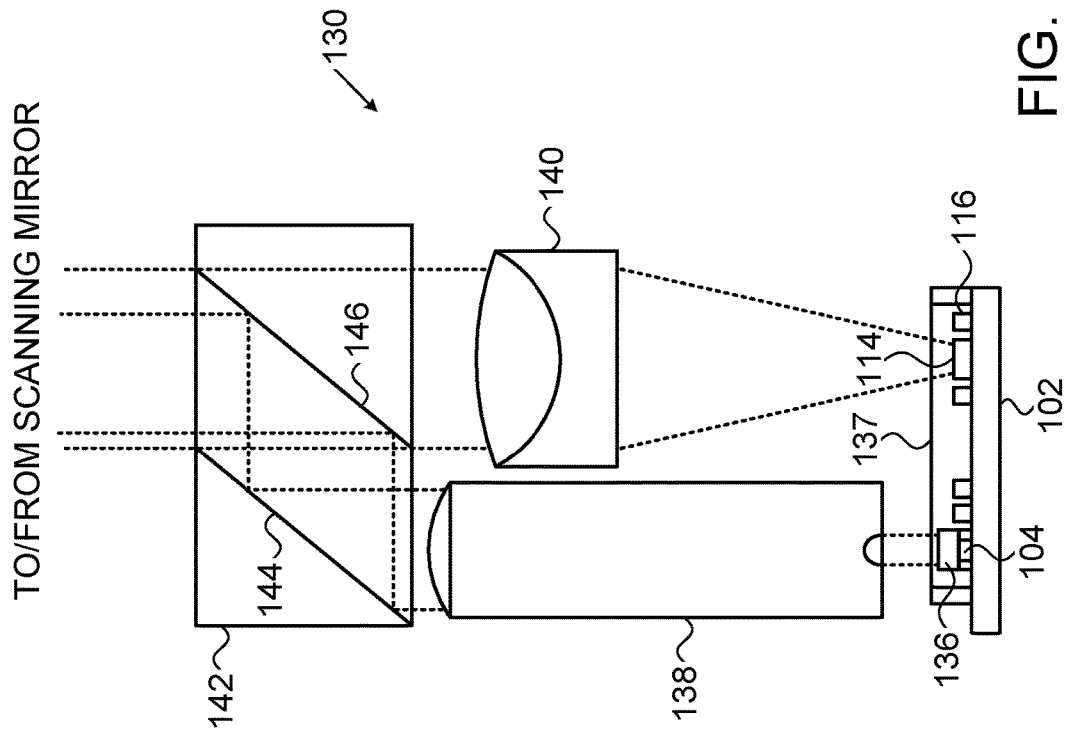
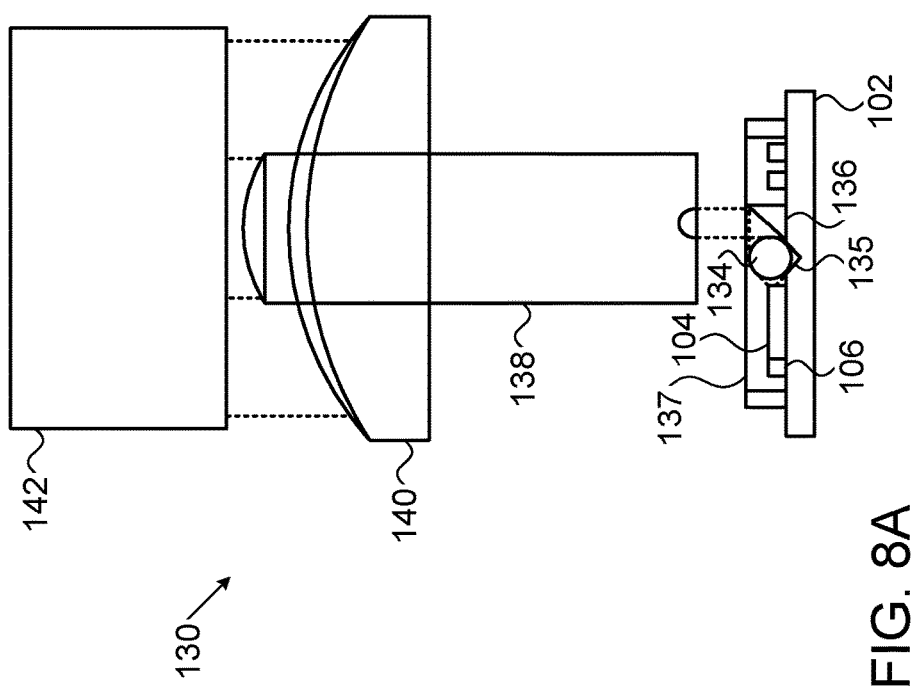
FIG. 8B
FIG. 8A

SCANNING DEPTH ENGINE

CROSS-REFERENCE TO RELATED APPLICATION

This application is a continuation of U.S. patent application Ser. No. 15/473,653, filed Mar. 30, 2017, which is a continuation of U.S. patent application Ser. No. 13/766,801, filed Feb. 14, 2013 (now U.S. Pat. No. 9,651,417), which claims the benefit of U.S. Provisional Patent Application 61/598,921, filed Feb. 15, 2012, which is incorporated herein by reference. This application is related to U.S. patent application Ser. No. 13/766,811, filed Feb. 14, 2013, entitled "Integrated Optoelectronic Modules" (now U.S. Pat. No. 9,157,790).

FIELD OF THE INVENTION

The present invention relates generally to methods and devices for projection and capture of optical radiation, and particularly to optical 3D mapping.

BACKGROUND

Various methods are known in the art for optical 3D mapping, i.e., generating a 3D profile of the surface of an object by processing an optical image of the object. This sort of 3D profile is also referred to as a 3D map, depth map or depth image, and 3D mapping is also referred to as depth mapping.

U.S. Patent Application Publication 2011/0279648 describes a method for constructing a 3D representation of a subject, which comprises capturing, with a camera, a 2D image of the subject. The method further comprises scanning a modulated illumination beam over the subject to illuminate, one at a time, a plurality of target regions of the subject, and measuring a modulation aspect of light from the illumination beam reflected from each of the target regions. A moving-mirror beam scanner is used to scan the illumination beam, and a photodetector is used to measure the modulation aspect. The method further comprises computing a depth aspect based on the modulation aspect measured for each of the target regions, and associating the depth aspect with a corresponding pixel of the 2D image.

U.S. Pat. No. 8,018,579 describes a three-dimensional imaging and display system in which user input is optically detected in an imaging volume by measuring the path length of an amplitude modulated scanning beam as a function of the phase shift thereof. Visual image user feedback concerning the detected user input is presented.

U.S. Pat. No. 7,952,781, whose disclosure is incorporated herein by reference, describes a method of scanning a light beam and a method of manufacturing a microelectromechanical system (MEMS), which can be incorporated in a scanning device.

U.S. Patent Application Publication 2012/0236379 describes a LADAR system that uses MEMS scanning. A scanning mirror includes a substrate that is patterned to include a mirror area, a frame around the mirror area, and a base around the frame. A set of actuators operate to rotate the mirror area about a first axis relative to the frame, and a second set of actuators rotate the frame about a second axis relative to the base. The scanning mirror can be fabricated using semiconductor processing techniques. Drivers for the scanning mirror may employ feedback loops that operate the mirror for triangular motions. Some embodiments of the scanning mirror can be used in a LADAR system for a Natural User Interface of a computing system.

The "MiniFaros" consortium, coordinated by SICK AG (Hamburg, Germany) has supported work on a new laser scanner for automotive applications. Further details are available on the minifaros.eu Web site.

SUMMARY

Embodiments of the present invention that are described hereinbelow provide improved apparatus and methods for depth mapping using a scanning beam.

There is therefore provided, in accordance with an embodiment of the present invention, mapping apparatus, including a transmitter, which is configured to emit a beam including pulses of light, and a scanner, which is configured to scan the beam, within a predefined scan range, over a scene. A receiver is configured to receive the light reflected from the scene and to generate an output indicative of a time of flight of the pulses to and from points in the scene. A processor is coupled to control the scanner so as to cause the beam to scan over a selected window within the scan range and to process the output of the receiver so as to generate a 3D map of a part of the scene that is within the selected window.

In some embodiments, the processor is configured to select a different window to scan in each scan of the beam. The processor may be configured to process the output of the receiver during a first scan, which may cover the entire scan range of the scanner, so as to generate a first 3D map of the scene, and to select the window to scan preferentially during a second scan responsively to a feature of the first 3D map.

The processor may be configured to identify an object in the first 3D map, and to define the window so as to contain the identified object. In a disclosed embodiment, the object includes at least a part of a body of a user of the apparatus, and the processor is configured to identify the part of the body responsively to a gesture made by the user during the first scan.

In one embodiment, the processor is configured to drive the scanner to scan the selected window with a resolution that is enhanced relative to the first scan. Alternatively or additionally, the processor is configured to drive the scanner to scan the second window at a frame rate that is higher than during the first scan. For at least some scans, the selected window need not be centered within the predefined scan range.

In some embodiments, the scanner includes a micromirror produced using micro-electro-mechanical systems (MEMS) technology, and the transmitter is configured to direct the beam to reflect from the micromirror toward the scene. The micromirror may be configured to rotate about two axes, wherein the processor is coupled to control a range of rotation of the micromirror about at least one of the axes in order to define the window.

Additionally or alternatively, the processor may be coupled to vary a speed of rotation of the micromirror about at least one of the axes in order to define the window. In one such embodiment, a range of the rotation of the micromirror is the same in both the first and second scans, and the processor is coupled to vary the speed of the rotation about the at least one of the axes during the second scan so that the speed of scanning of the micromirror over the selected window is slower than over other parts of the range.

In some embodiments, the scanner includes a substrate, which is etched to define the micromirror and a support, along with first spindles connecting the micromirror to the support along a first axis and second spindles connecting the support to the substrate along a second axis. An electromagnetic drive causes the micromirror and the support to rotate about the first and second spindles. The electromagnetic drive may include a stator assembly, including at least one magnetic core having an air gap and at least one coil wound on the magnetic core, and at least one rotor, on which the micromirror and the support are mounted and which is suspended in the air gap so as to move within the air gap in response to a current driven through the at least one coil. In a disclosed embodiment, the at least one magnetic core and the at least one rotor include two cores and two rotors suspended in respective air gaps of the cores, and the electromagnetic drive is configured to drive coils on the two cores with differential currents so as to cause the micromirror and the support to rotate at different, respective speeds so that the micromirror scans in a raster pattern.

In some embodiments, the electromagnetic drive causes the micromirror to rotate about the first spindles at a first frequency, which is a resonant frequency of rotation, while causing the support to rotate about the second spindles at a second frequency, which is lower than the first frequency and may not be a resonant frequency. In a disclosed embodiment, the support includes a first support, which is connected by the first spindles to the micromirror, a second support, which is connected by the second spindles to the substrate, and third spindles, connecting the first support to the second support, wherein the electromagnetic drive is configured to cause the first support to rotate relative to the second support about the third spindles.

Typically, the receiver includes a detector, which is configured to receive the reflected light from the scene via the micromirror. In a disclosed embodiment, the apparatus includes a beamsplitter, which is positioned so as to direct the beam emitted by the transmitter toward the micromirror, while permitting the reflected light to reach the detector, wherein the emitted beam and the reflected light have respective optical axes, which are parallel between the beamsplitter and the micromirror. The beamsplitter may be patterned with a polarizing reflective coating over only a part of a surface of the beamsplitter, and may be positioned so that the patterned part of the surface intercepts the beam from the transmitter and reflects the beam toward the micromirror. Optionally, the beamsplitter may include a bandpass coating on a reverse side of the beamsplitter, configured to prevent light outside an emission band of the transmitter from reaching the receiver. The transmitter and the receiver may be mounted together on the micro-optical substrate in a single integrated package.

In a disclosed embodiment, the processor is configured to variably control a power level of the pulses emitted by the transmitter responsively to a level of the output from the receiver in response to one or more previous pulses.

There is additionally provided, in accordance with an embodiment of the present invention, a method for mapping, which includes operating a scanner so as to scan a beam including pulses of light, within a predefined scan range, over a scene. The light reflected from the scene is received, and an output is generated indicative of a time of flight of the pulses to and from points in the scene. The scanner is controlled, during operation of the scanner, so as to cause the beam to scan preferentially over a selected window within the scan range. The output of the receiver is processed so as to generate a 3D map of a part of the scene that is within the selected window.

There is furthermore provided, in accordance with an embodiment of the present invention, mapping apparatus, which includes a transmitter, which is configured to emit a beam including pulses of light, and a scanner, which is configured to scan the beam over a scene. A receiver is configured to receive the light reflected from the scene and to generate an output indicative of a time of flight of the pulses to and from points in the scene. A processor is coupled to process the output of the receiver during a first scan of the beam so as to generate a 3D map of the scene, while controlling a power level of the pulses emitted by the transmitter responsively to a level of the output from the receiver in response to one or more previous pulses.

Typically, the processor is configured to control the power level of the pulses so as to reduce variations in an intensity of the reflected light that is received from different parts of the scene. The one or more previous pulses may include scout pulses emitted by the transmitter in order to assess and adjust the power level.

The present invention will be more fully understood from the following detailed description of the embodiments thereof, taken together with the drawings in which:

BRIEF DESCRIPTION OF THE DRAWINGS

FIGS. 8A and 8B are schematic side views of an optoelectronic module, in accordance with yet another embodiment of the present invention;

DETAILED DESCRIPTION OF EMBODIMENTS

Overview

PCT International Publication WO 2012/020380, which is assigned to the assignee of the present patent application and whose disclosure is incorporated herein by reference, describes apparatus for mapping, which includes an illumination module. This module includes a radiation source, which is configured to emit a beam of radiation, and a scanner, which is configured to receive and scan the beam over a selected angular range. Illumination optics project the scanned beam so as to create a pattern of spots extending over a region of interest. An imaging module captures an image of the pattern that is projected onto an object in the region of interest. A processor processes the image in order to construct a three-dimensional (3D) map of the object.

In contrast to such image-based mapping systems, some embodiments of the present invention that are described hereinbelow provide depth engines that generate 3D mapping data by measuring the time of flight of a scanning beam. A light transmitter, such as a laser, directs short pulses of light toward a scanning mirror, which scans the light beam over a scene of interest within a certain scan range. A receiver, such as a sensitive, high-speed photodiode (for example, an avalanche photodiode) receives light returned from the scene via the same scanning mirror. Processing circuitry measures the time delay between the transmitted and received light pulses at each point in the scan. This delay is indicative of the distance traveled by the light beam, and hence of the depth of the object at the point. The processing circuitry uses the depth data thus extracted in producing a 3D map of the scene.

Systems based on this sort of depth engine are able to provide dynamic, interactive zooming functionality. The scanner can be controlled so as to cause the beam to scan over a selected window within the scan range and thus generate a 3D map of a part of the scene that is within the selected window. A different window may be selected in each scan of the beam. For example, after first scanning over a wide angular range and creating a wide-angle, low-resolution 3D map of the scene of interest (possibly scanning the entire range), the depth engine may be controlled to zoom in on particular windows or objects that have been identified within the scene. Zooming in this manner enables the depth engine to provide data within the selected window at higher resolution or, alternatively or additionally, to increase the frame rate at which it scans.

System Description

Figure 1:
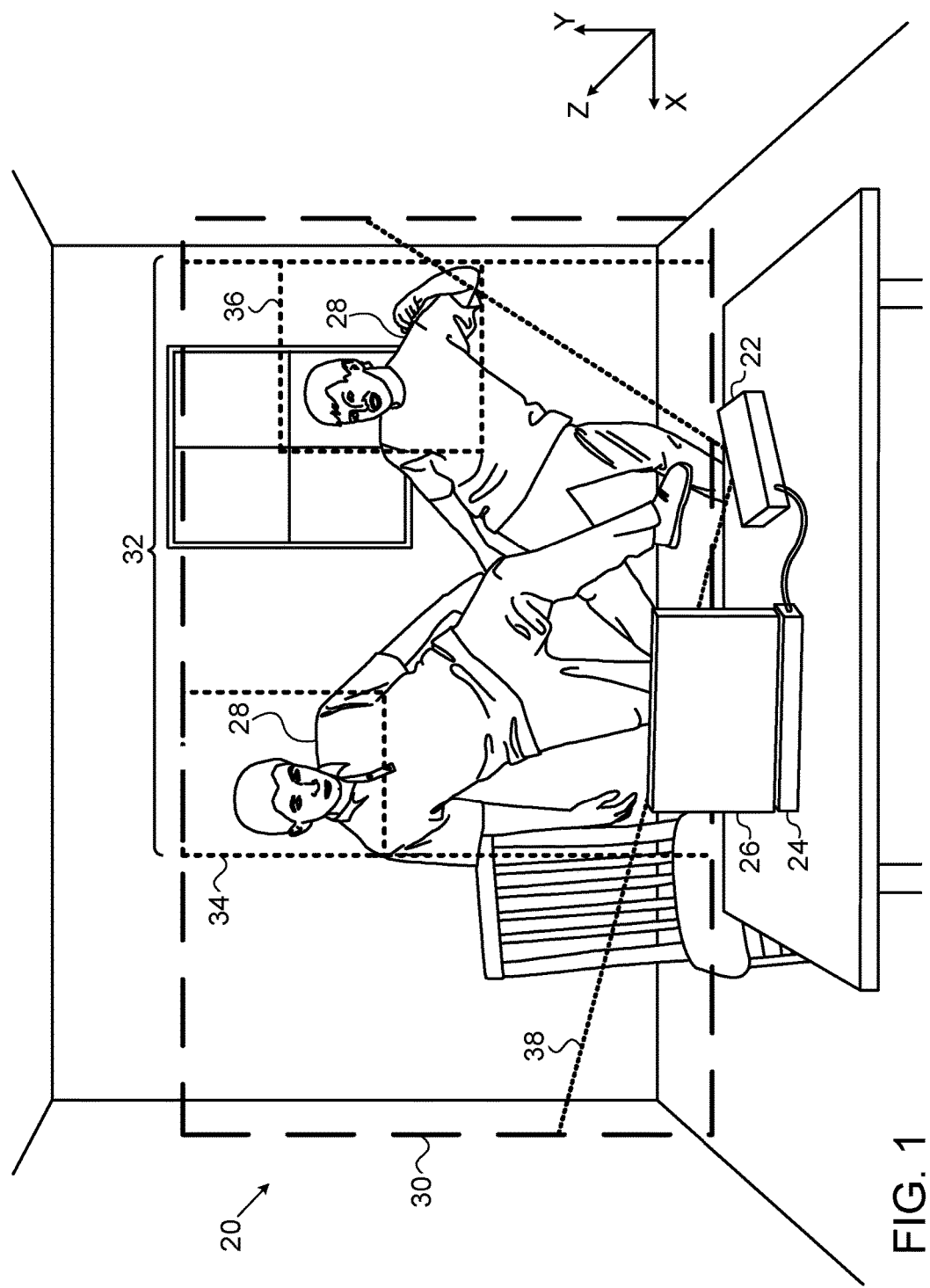
FIG. 1 is a schematic, pictorial illustration of a depth mapping system, in accordance with an embodiment of the present invention.

FIG. 1 is a schematic, pictorial illustration of a depth mapping system 20, in accordance with an embodiment of the present invention. The system is based on a scanning depth engine 22, which captures 3D scene information in a volume of interest (VOI) 30 that includes one or more objects. In this example, the objects comprise at least parts of the bodies of users 28. Engine 22 outputs a sequence of frames containing depth data to a computer 24, which processes and extracts high-level information from the map data. This high-level information may be provided, for example, to an application running on computer 24, which drives a display screen 26 accordingly.

Computer 24 processes data generated by engine 22 in order to reconstruct a depth map of VOI 30 containing users 28. In one embodiment, engine 22 emits pulses of light while scanning over the scene and measures the relative delay of the pulses reflected back from the scene. A processor in engine 22 or in computer 24 then computes the 3D coordinates of points in the scene (including points on the surface of the users' bodies) based on the time of flight of the light pulses at each measured point (X,Y) in the scene. This approach is advantageous in that it does not require the users to hold or wear any sort of beacon, sensor, or other marker. It gives the depth (Z) coordinates of points in the scene relative to the location of engine 22 and permits dynamic zooming and shift of the region that is scanned within the scene. Implementation and operation of the depth engine are described in greater detail hereinbelow.

Although computer 24 is shown in FIG. 1, by way of example, as a separate unit from depth engine 22, some or all of the processing functions of the computer may be performed by a suitable microprocessor and software or by dedicated circuitry within the housing of the depth engine or otherwise associated with the depth engine. As another alternative, at least some of these processing functions may be carried out by a suitable processor that is integrated with display screen 26 (in a television set, for example) or with any other suitable sort of computerized device, such as a game console or media player. The sensing functions of engine 22 may likewise be integrated into computer 24 or other computerized apparatus that is to be controlled by the depth output.

For simplicity and clarity in the description that follows, a set of Cartesian axes is marked in FIG. 1. The Z-axis is taken to be parallel to the optical axis of depth engine 22. The frontal plane of the depth engine is taken to be the X-Y plane, with the X-axis as the horizontal. These axes, however, are defined solely for the sake of convenience. Other geometrical configurations of the depth engine and its volume of interest may alternatively be used and are considered to be within the scope of the present invention.

FIG. 1 illustrates the zoom capabilities of depth engine 22. Initially, a beam 38 emitted by engine 22 scans the entire VOI 30 and generates a low-resolution depth map of the entire scene. The scan range may be large, as shown in the figure, for example 120° (X)×80° (Y). (References to the "scan range" in the present description mean the full range over which the mapping system is intended to operate, which may be smaller than the total range over which the scanner in depth engine 22 is physically capable of scanning.) Computer 24 identifies users 28 and instructs engine 22 to narrow its scan range to a window 32 containing the users, and thus generate a higher-resolution depth map of the objects in the window. Optionally, computer 24 may instruct engine 22 to zoom in still farther on specific parts or features of the users' faces and bodies, as exemplified by windows 34 and 36. The instructions and their execution by engine 22 may be dynamic, i.e., computer 24 may instruct engine 22 to modify the scan window during operation of the scanner. Thus, for example, the locations of the windows may change from frame to frame in response to movement of the users or other changes in the scene or application requirements. As shown in the figure, the windows need not be centered within the scan range and can be located practically anywhere within the range.

These dynamic zoom functions are implemented by controlling the scan range of engine 22. Typically, engine 22 scans VOI 30 in a raster pattern. For example, to generate window 32, the X-range of the raster scan is reduced, while the Y-range remains unchanged. This sort of windowing can be conveniently accomplished when the depth engine scans rapidly in the Y-direction, in a resonant scan with a fixed amplitude and frequency (such as 5-10 kHz), while scanning more slowly in the X-direction at the desired frame rate (such as 30 Hz). The X-direction scan is not a resonant frequency of rotation. Thus, the speed of the X-direction scan can be varied over the scan range so that each frame contains multiple vertical windows, such as scanning a respective window over each of users 28 while skipping over the space between them. As another alternative, the Y-range of the scan may be reduced, thus reducing the overall vertical field of view.

Additionally or alternatively, the Y-range of the scan may be controlled, as well, thus giving scan windows 34 and 36 with different ranges in both X and Y. Furthermore, the Y- and/or X-range and X-offset of the scan may be modulated during each frame, so that non-rectangular windows may be scanned.

Computer 24 may instruct depth engine 22 to change the zoom (i.e., to change the sizes and/or locations of the zoom windows) via a command interface provided by the depth engine. The computer may run an application program interface (API) and/or suitable middleware so that application programs running on the computer can invoke the command interface.

Various zoom control models can be implemented by the computer or, alternatively or additionally, by embedded software in depth engine 22. As noted earlier, the computer or depth engine may change the zoom on the fly based on analysis of the depth map. Initially, the depth engine and computer may operate in a wide-angle, low-resolution search mode, and may then zoom into a higher-resolution tracking mode when a user is identified in the scene. For example, when a user enters the scene, the computer may detect the presence and location of the user and instruct the depth engine to zoom in on his location. When the user then makes a certain gesture, the computer may detect the gesture and instruct the depth engine to zoom in further on the user's hand.

Scanning mirror designs and other details of the depth engine that support the above sorts of schemes are described with reference to the figures that follow.

Figure 2:
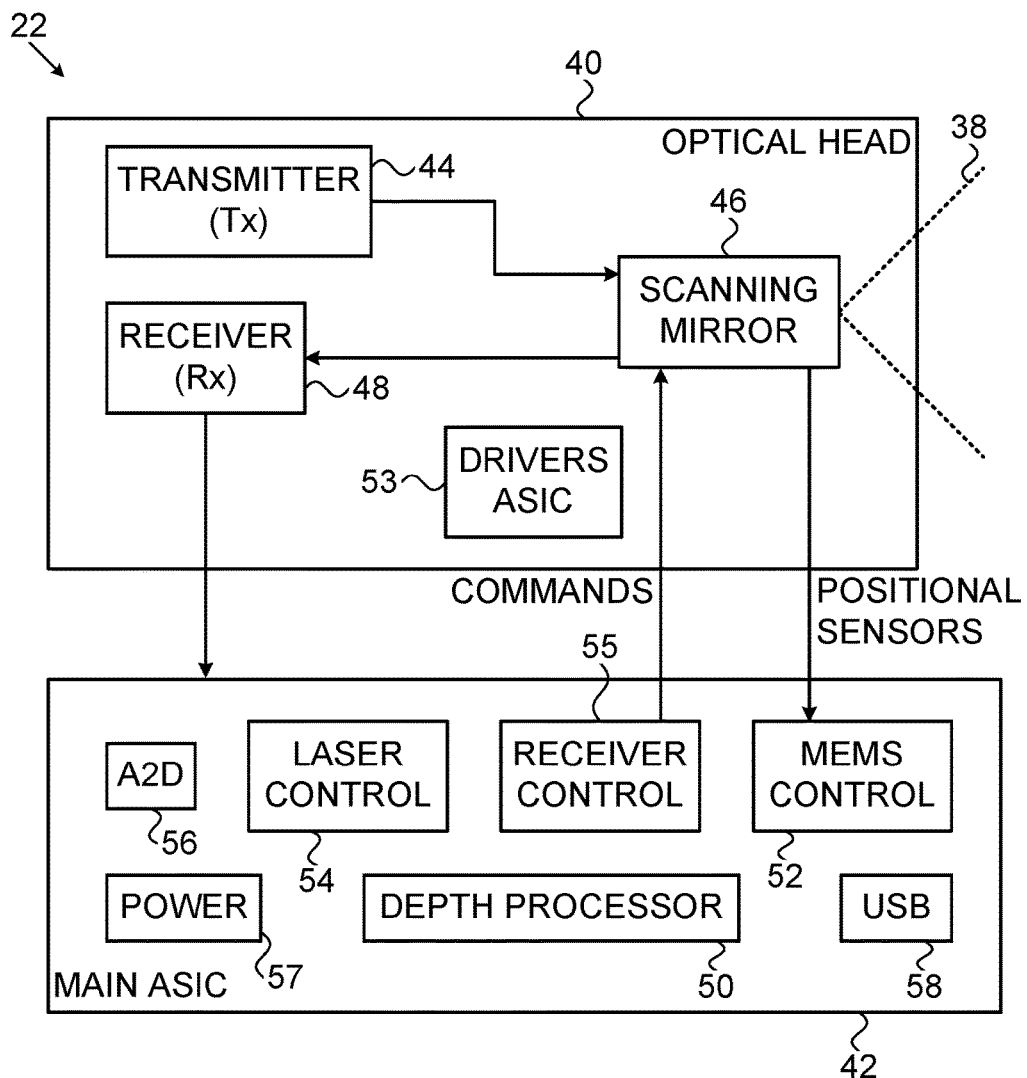
FIG. 2 is a block diagram that schematically shows functional components of a depth engine, in accordance with an embodiment of the present invention.

FIG. 2 is a block diagram that schematically shows functional components of depth engine 22, in accordance with an embodiment of the present invention. Engine 22 comprises an optical head 40 and a controller 42 (also referred to as a processor), which may be implemented as an application-specific integrated circuit (ASIC), as indicated in the figure.

Optical head 40 comprises a transmitter 44, such as a laser diode, whose output is collimated by a suitable lens. Transmitter 44 outputs a beam of light, which may comprise visible, infrared, and/or ultraviolet radiation (all of which are referred to as "light" in the context of the present description and in the claims). A laser driver, which may similarly be implemented in an ASIC 53, modulates the laser output, so that it emits short pulses, typically with sub-nanosecond rise time. The laser beam is directed toward a scanning micromirror 46, which may be produced and driven using MEMS technology, as described below. The micromirror scans beam 38 over the scene, typically via projection/collection optics, such as a suitable lens (shown in the figures below).

Pulses of light reflected back from the scene are collected by the optics and reflect from scanning mirror 46 onto a receiver 48. (Alternatively, in place of a single mirror shared by the transmitter and the receiver, a pair of synchronized mirrors may be used, one for the transmitter and the other for the receiver, while still supporting the interactive zooming capabilities of engine 22.) The receiver typically comprises a sensitive, high-speed photodetector, such as an avalanche photodiode (APD), along with a sensitive amplifier, such as a transimpedance amplifier (TIA), which amplifies the electrical pulses output by the photodetector. These pulses are indicative of the times of flight of the corresponding pulses of light.

The pulses that are output by receiver 48 are processed by controller 42 in order to extract depth (Z) values as a function of scan location (X,Y). For this purpose, the pulses may be digitized by a high-speed analog/digital converter (A2D) 56, and the resulting digital values may be processed by depth processing logic 50. The corresponding depth values may be output to computer 24 via a USB port 58 or other suitable interface.

In some cases, particularly near the edges of objects in the scene, a given projected light pulse may result in two reflected light pulses that are detected by receiver 48—a first pulse reflected from the object itself in the foreground, followed by a second pulse reflected from the background behind the object. Logic 50 may be configured to process both pulses, giving two depth values (foreground and background) at the corresponding pixel. These dual values may be used by computer 24 in generating a more accurate depth map of the scene.

Controller 42 also comprises a power converter 57, to provide electrical power to the components of engine 22, and controls the transmit, receive, and scanning functions of optical head 40. For example, a MEMS control circuit 52 in controller 42 may direct commands to the optical head to modify the scanning ranges of mirror 46, as explained above. Position sensors associated with the scanning mirror, such as suitable inductive or capacitive sensors (not shown), may provide position feedback to the MEMS control function. A laser control circuit 54 and a receiver control circuit 55 likewise control aspects of the operation of transmitter 44 and receiver 48, such as amplitude, gain, offset, and bias.

The laser driver in ASIC 53 and/or laser control circuit 54 may control the output power of transmitter 44 adaptively, in order to equalize the level of optical power of the pulses that are incident on receiver 48. This adaptation compensates for variations in the intensity of the reflected pulses that occurs due to variations in the distance and reflectivity of objects in different parts of the scene from which the light pulses are reflected. It is thus useful in improving signal/noise ratio while avoiding detector saturation. For example, the power of each transmitted pulse may be adjusted based on the level of the output from receiver 48 in response to one or more previous pulses, such as the preceding pulse or pulses emitted by the transmitter in the present scan, and/or the pulse at this X,Y position of mirror 46 in the preceding scan. Optionally, the elements of optical head 40 may be configured to transmit and receive "scout pulses," at full or partial power, for the purpose of assessing returned power or object distance, and may then adjust the output of transmitter 44 accordingly.

Optical Scanning Head

Figure 3:
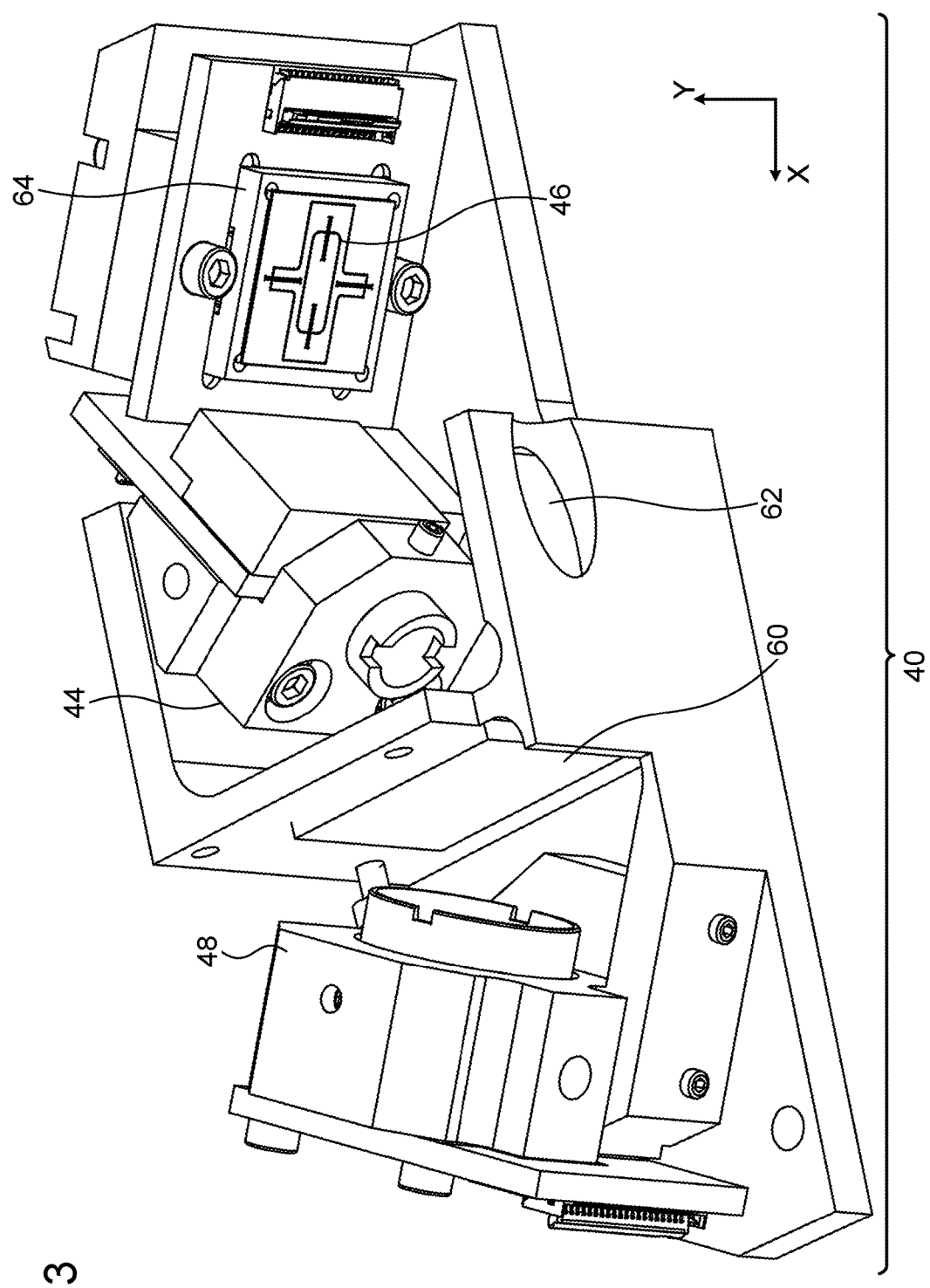
FIG. 3 is a schematic, pictorial illustration of an optical scanning head, in accordance with an embodiment of the present invention.

FIG. 3 is a schematic, pictorial illustration showing elements of optical head 40, in accordance with an embodiment of the present invention. Transmitter 44 emits pulses of light toward a polarizing beamsplitter 60. Typically, only a small area of the beamsplitter, directly in the light path of transmitter 60, is coated for reflection, while the remainder of the beamsplitter is fully transparent (or even anti-reflection coated) to permit returned light to pass through to receiver 48. The light from transmitter 44 reflects off beamsplitter 60 and is then directed by a folding mirror 62 toward scanning micromirror 46. A MEMS scanner 64 scans micromirror 46 in X- and Y-directions with the desired scan frequency and amplitude. Details of the micromirror and scanner are shown in the figures that follow.

Light pulses returned from the scene strike micromirror 46, which reflects the light via turning mirror 62 through beamsplitter 60. Receiver 48 senses the returned light pulses and generates corresponding electrical pulses. To enhance sensitivity of detection, the overall area of beamsplitter 60 and the aperture of receiver 48 are considerably larger than the area of the transmitted beam, and the beamsplitter is accordingly patterned, i.e., the reflective coating extends over only the part of its surface on which the transmitted beam is incident. The reverse side of the beamsplitter may have a bandpass coating, to prevent light outside the emission band of transmitter 44 from reaching the receiver. It is also desirable that micromirror 46 be as large as possible, within the inertial constraints imposed by the scanner. For example, the area of the micromirror may be about 10-15 $mm^2$.

The specific mechanical and optical designs of the optical head shown in FIG. 3 are described here by way of example, and alternative designs implementing similar principles are considered to be within the scope of the present invention. Other examples of optoelectronic modules that can be used in conjunction with a scanning micromirror are described hereinbelow.

Figure 4:
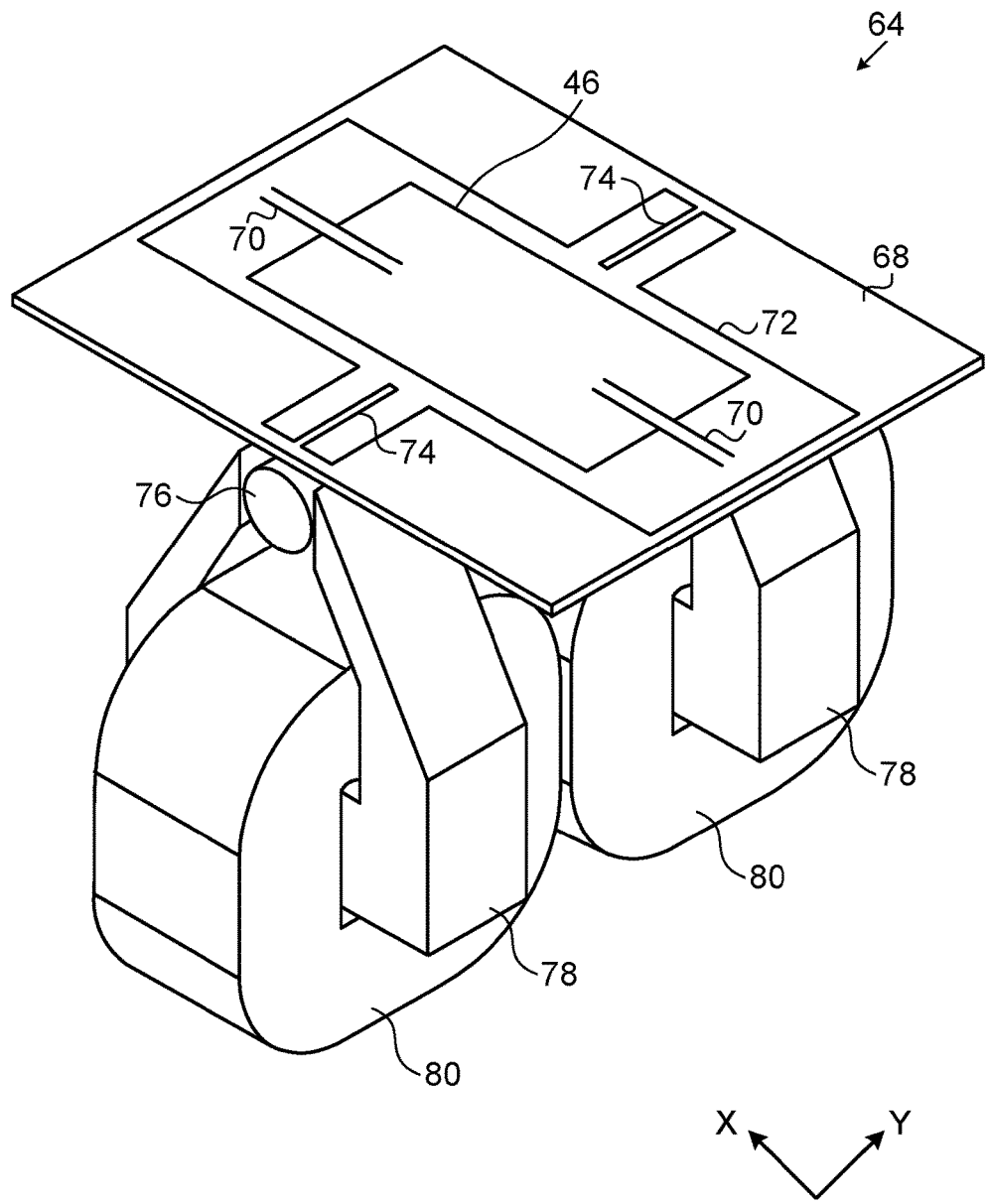
FIG. 4 is a schematic, pictorial illustration of a MEMS scanner, in accordance with an embodiment of the present invention.

FIG. 4 is a schematic, pictorial illustration of MEMS scanner 64, in accordance with an embodiment of the present invention. This scanner is produced and operates on principles similar to those described in the above-mentioned U.S. Pat. No. 7,952,781, but enables two-dimensional scanning of a single micromirror 46. Dual-axis MEMS-based scanners of this type are described further in U.S. Provisional Patent Application 61/675,828, filed Jul. 26, 2012, which is incorporated herein by reference. Alternative embodiments of the present invention, however, may use scanners of other types that are known in the art, including designs that use two single-axis scanners (such as those described in U.S. Pat. No. 7,952,781, for example).

Micromirror 46 is produced by suitably etching a semiconductor substrate 68 to separate the micromirror from a support 72, and to separate the support from the remaining substrate 68. After etching, micromirror 46 (to which a suitable reflective coating is applied) is able to rotate in the Y-direction relative to support 72 on spindles 70, while support 72 rotates in the X-direction relative to substrate 68 on spindles 74.

Micromirror 46 and support 72 are mounted on a pair of rotors 76, which comprise permanent magnets. (Only one of the rotors is visible in the figure.) Rotors 76 are suspended in respective air gaps of magnetic cores 78. Cores 78 are wound with respective coils 80 of conductive wire, thus creating an electromagnetic stator assembly. (Although a single coil per core is shown in FIG. 4 for the sake of simplicity, two or more coils may alternatively be wound on each core; and different core shapes may also be used.) Driving an electrical current through coils 80 generates a magnetic field in the air gaps, which interacts with the magnetization of rotors 76 so as to cause the rotors to rotate or otherwise move within the air gaps.

Specifically, coils 80 may be driven with high-frequency differential currents so as to cause micromirror 46 to rotate resonantly back and forth about spindles 70 at high speed (typically in the range of 5-10 kHz, as noted above, although higher or lower frequencies may also be used). This resonant rotation generates the high-speed Y-direction raster scan of the output beam from engine 22. At the same time, coils 80 are driven together at lower frequency to drive the X-direction scan by rotation of support 72 about spindles 74 through the desired scan range. The X- and Y-rotations together generate the overall raster scan pattern of micromirror 46.

Figure 5:
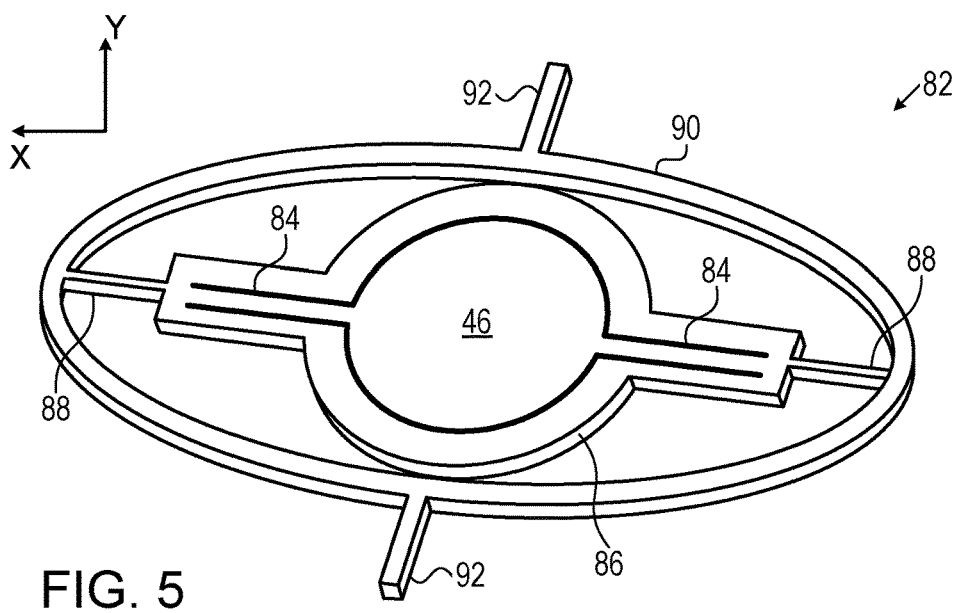
FIG. 5 is a schematic, pictorial illustration of a micromirror unit, in accordance with another embodiment of the present invention.

FIG. 5 is a schematic, pictorial illustration of a micromirror unit 82, in accordance with another embodiment of the present invention. Assembly 82 may be produced and operated using MEMS technology in a manner similar to that described above with reference to scanner 64. In this embodiment, micromirror 46 is connected by spindles 84 to a Y-support 86, which is connected by spindles 88 to an X-support 90. The X-support is connected by spindles 92 to a substrate (not shown in this figure). Micromirror 46 rotates resonantly back and forth at high frequency on spindles 84, thus generating the high-speed Y-direction scan described above. Y- and X-supports 86 and 90 rotate at lower speed, with variable amplitude and offset, to define the X-Y windows over which assembly 82 will scan. This arrangement may be used conveniently, for example, to generate a scan over windows 34 and 36, as shown in FIG. 1.

The particular MEMS-based scanners shown in FIGS. 4 and 5 are described here by way of example. In alternative embodiments, other types of MEMS scanners may be used in depth engine 22, as well as suitable scanners based on other scanning technologies. All such implementations are considered to be within the scope of the present invention.

Various scan modes can be enabled by applying appropriate drive signals to the sorts of micromirror-based scanners that are described above. The possibility of zooming in on particular windows was already mentioned above. As noted earlier, even when the entire field of view is scanned, the X-direction scan rate may be varied over the course of the scan to give higher resolution within one or more regions, by scanning the micromirror relatively slowly over these regions, while scanning the remainder of the scene at a faster rate. These high-resolution scans of particular regions can be interlaced, frame by frame, with low-resolution scans over the entire scene by maintaining a fixed X-direction scan rate as the micromirror scans over the scene in one direction (for example, scanning from left to right) to give the low-resolution depth map, and varying the X-direction scan rate between fast and slow while scanning in the reverse direction (on the return scan from right to left) to map the high-resolution window. Other sorts of variable, interlaced scan patterns may similarly be implemented by application of suitable drive signals.

Optoelectronic Modules

Assembly of optical head 40 from discrete optical and mechanical components, as shown in FIG. 3, requires precise alignment and can be costly. In alternative embodiments, all parts requiring precise placement and alignment (such as the light transmitter, receiver, and associated optics) may be combined in a single integrated, modular package on micro-optical substrate, such as a silicon optical bench (SiOB) or other type of micro-optical bench based on a semiconductor or ceramic substrate, such as alumina, aluminum nitride, or glass (Pyrex®). This approach can save costs and may make the depth engine easier to handle.

Figure 6A:
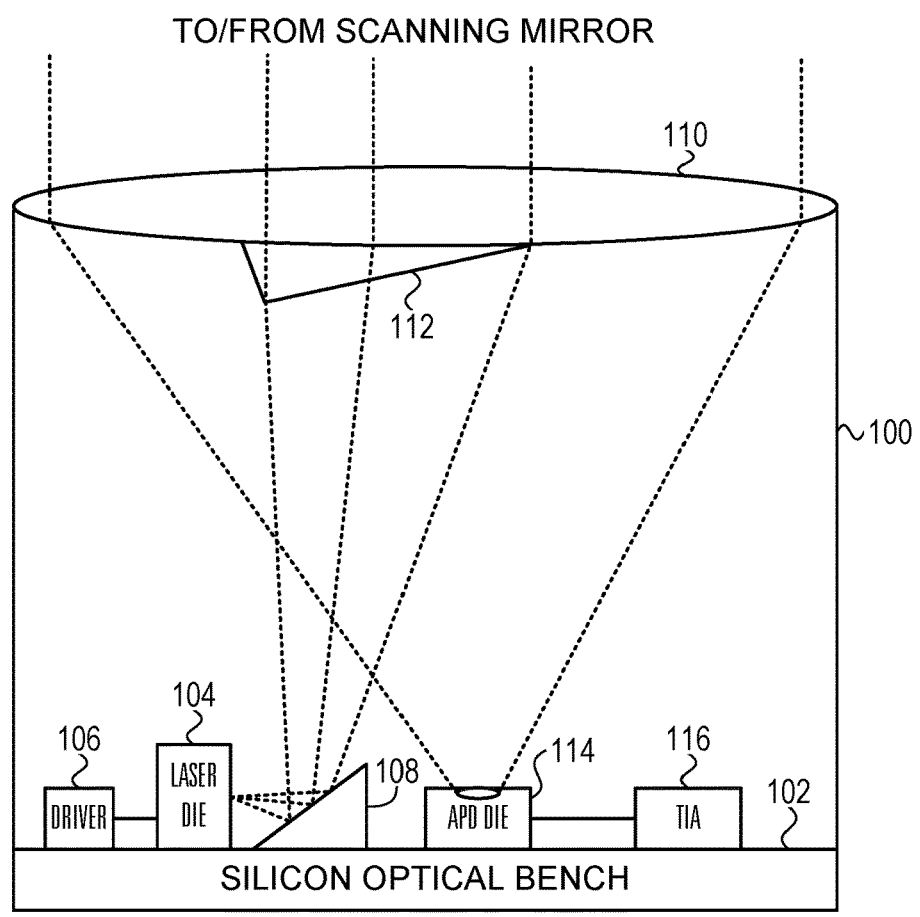
FIGS. 6A and 6B are schematic side view of optoelectronic modules, in accordance with embodiments of the present invention.

FIG. 6A is a schematic side view of an optoelectronic module 100 of this sort, in accordance with an embodiment of the present invention. A laser die 104, serving as the transmitter, and a driver chip 106 are placed on a silicon optical bench (SiOB) 102. Laser die 104 in this embodiment is an edge-emitting device, but in other embodiments, surface-emitting devices may be used, as described hereinbelow. The laser output beam from die 104 reflects from a turning mirror 108 and is collimated by a lens 110. A prism 112 may be placed in the laser beam in order to align its beam axis with that of the receiver. Prism 112 may be made as a monolithic part of lens 110, and typically covers a small fraction of the area of the lens (such as 1/10 of the lens clear aperture).

The laser typically has significantly lower numerical aperture (NA) than lens 110. Therefore, the laser beam at the lens will be much narrower than the return beam captured by the lens. (Optionally, a ball lens may be placed on SiOB 102 between laser die 104 and mirror 108, as shown in FIG. 8A, for example, in order to reduce the numerical aperture of the beam that is seen by lens 110. Additionally or alternatively, an additional lens element may be added to lens 110 to collimate the outgoing laser beam, similar to the lens element shown in FIG. 6B.) The output laser beam from module 100 strikes the scanning mirror, which scans the beam over the scene of interest.

Light returned from the scene via the scanning mirror is collected by lens 110, which focuses the light onto an avalanche photodiode (APD) die 114 on bench 102. The output of the APD is amplified by a transimpedance amplifier (TIA) 116, as explained above. Alternatively, other sorts of detectors and amplifiers may be used in module 100 (and in the alternative module designs that are described below), as long as they have sufficient sensitivity and speed for the application at hand. Lens 110 may present different or similar collimation properties to laser and APD, since transmission and reception use different portions of the lens.

Lens 110 may be produced by means of wafer-level optics or molding of polymeric materials or glass, for example. Such a lens may have "legs," which create the side walls of module 100, thus sealing the module. Assembly of module 100 may be performed at wafer level, wherein a wafer of SiOB with mounted dies is bonded to a wafer of lenses, and then diced. Alternatively, a spacer wafer with appropriately-formed cavities may be bonded to the SiOB wafer, and the lens wafer bonded on top of it. Further alternatively, the assembly may be carried out using singulated silicon optical benches and lenses. In any case, the entire module 100 will have the form of a hollow cube, typically about 5-8 mm on a side. (Alternatively, the micro-optical bench and the components thereon may be sealed with a transparent cap, and lens 110 with other associate optics may then be assembled as a precision add-on, in both this embodiment and the other embodiments described below).

Figure 6B:
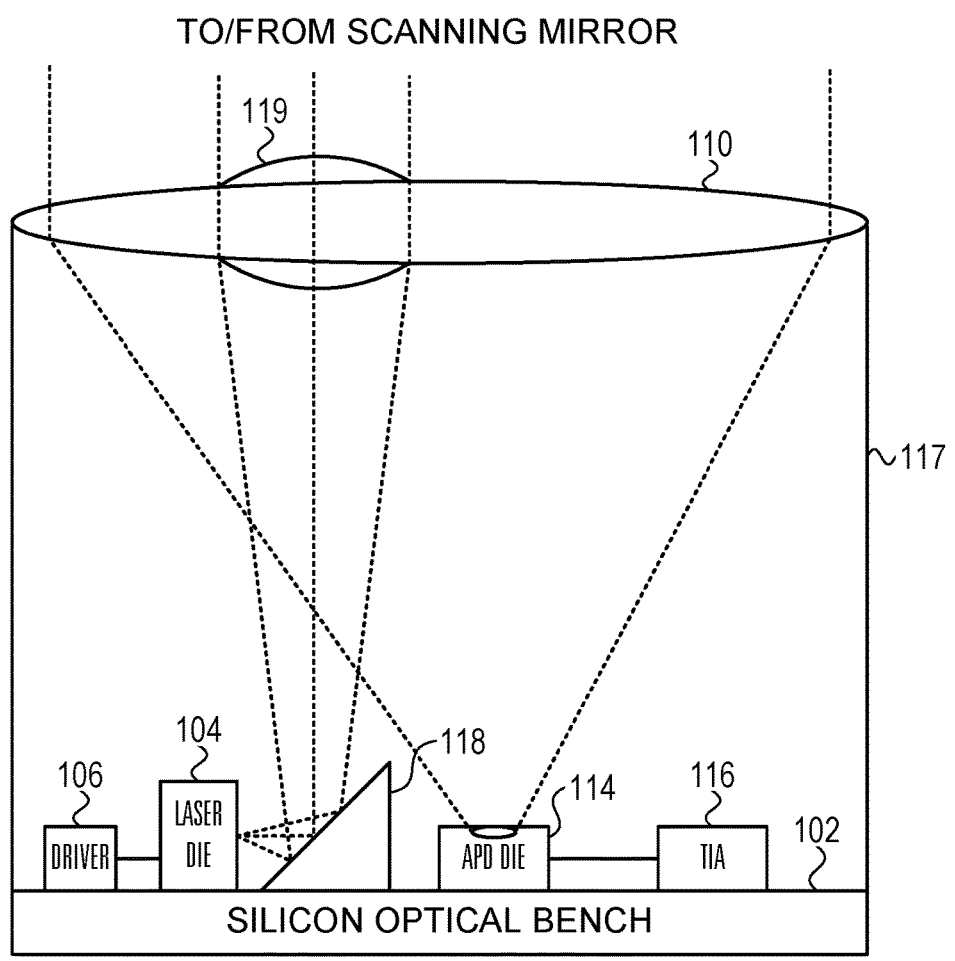

FIG. 6B is a schematic side view of an optoelectronic module 117, in accordance with another embodiment of the present invention. Module 117 is similar to module 100, except that in module 117 a mirror 118 that reflects the beam from laser die 104 is angled at approximately 45°, and thus the laser beam is reflected along an axis parallel to the optical axis of the received light (referred to herein as the "collection axis") that is defined by lens 110 and APD die 114. (The collection axis is a matter of design choice, and can be slanted relative to the plane of APD die 114.) In this configuration, prism 112 is not needed, but an additional lens element 119 may be added, by molding element 119 together with lens 110, for example, to collimate the outgoing laser beam. As long as the projected beam from laser die 104 and the collection axis of APD die 114 are parallel, the offset between the axes in this embodiment has no substantial effect on system performance.

The angles of mirrors 108 and 118 in the foregoing figures are shown by way of example, and other angles, both greater than and less than 45°, may alternatively be used. It is generally desirable to shield APD die 114 from any stray light, including back-reflected light from the beam emitted by laser die 104. For this reason, the sharper reflection angle of mirror 118 (by comparison with mirror 108 in the embodiment of FIG. 6A) is advantageous. In an alternative embodiment (not shown in the figures) even a sharper reflection angle may be used, with suitable adaptation of the corresponding projection optics for the laser beam. For example, SiOB 102 or alternatively, a silicon spacer wafer (not shown) placed on top of SiOB 102, may comprise a (100) silicon crystal, and may be wet-etched along the (111) plane and then coated with metal or with a dielectric stack to form a mirror at an inclination of 54.74°. In this case, lens 110 may be slanted or otherwise configured to focus off-axis onto APD die 114. Optionally, module 100 or 117 may also include light baffling or other means (not shown) for shielding the APD die from stray reflections of the laser beam. Alternatively or additionally, for angles greater than 45°, APD die 114 may be placed behind laser die 104, rather than in front of it as shown in the figures.

Figure 7:
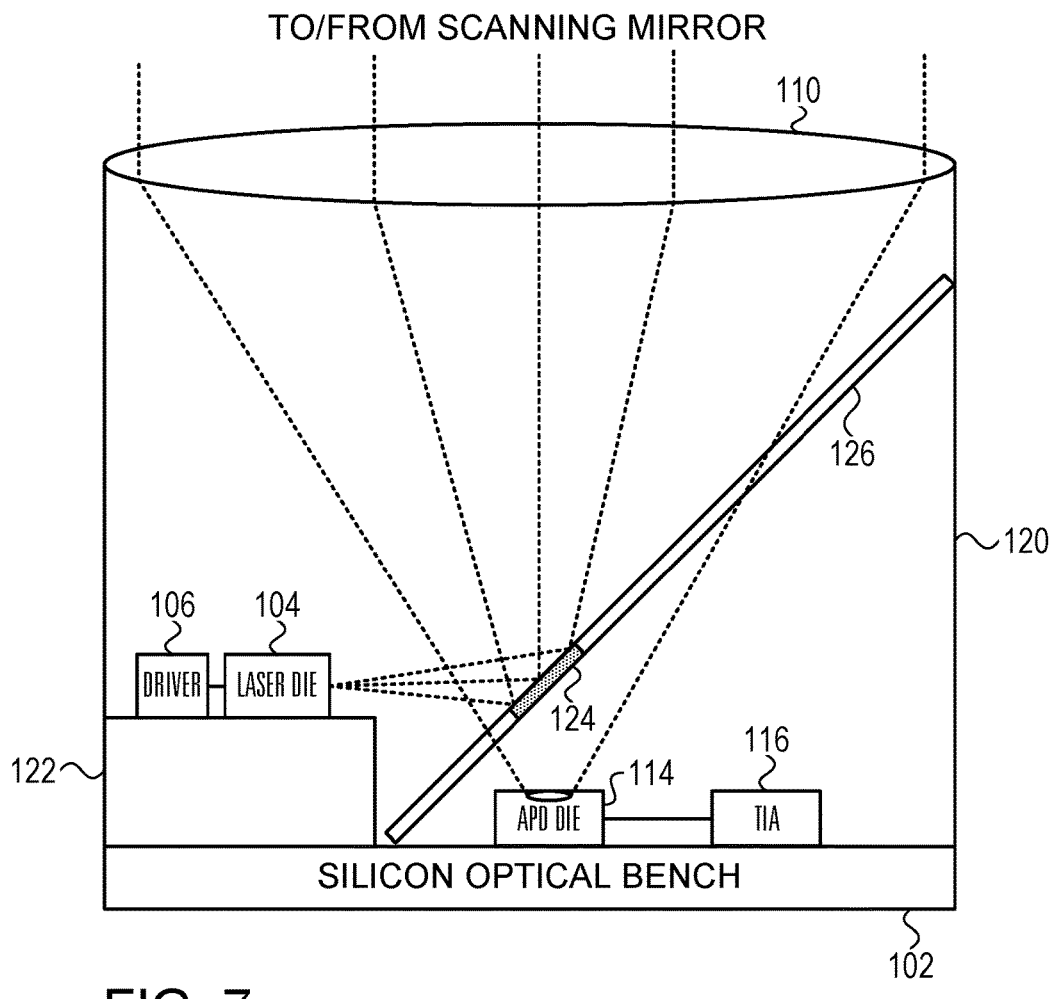
FIG. 7 is a schematic side view of an optoelectronic module, in accordance with another embodiment of the present invention.

FIG. 7 is a schematic side view of an optoelectronic module 120, in accordance with still another embodiment of the present invention. This module is similar to modules 100 and 117, except that the transmitter elements (laser die 104 and driver 106) are placed on a pedestal 122, and a beamsplitter 124 is mounted over SiOB 102 in order to align the transmitted and received beams. Beamsplitter 124 may comprise a small, suitably coated region on a transparent plate 126, which is oriented diagonally in module 120. When laser die 104 is configured to output a polarized beam, beamsplitter 124 may be polarization dependent, so as to reflect the polarization direction of the laser beam while passing the orthogonal polarization, thereby enhancing the optical efficiency of the module.

FIGS. 8A and 8B are schematic side views of an optoelectronic module 130, in accordance with yet another embodiment of the present invention. The view shown in FIG. 8B is rotated by 90° relative to that in FIG. 8A, so that items that are seen at the front of the view of FIG. 8A are on the left side of FIG. 8B. This embodiment differs from the preceding embodiments in that the transmitted and received beams are separate within module 130 and are aligned at the exit from the module by a beam combiner 142 mounted over the substrate of the module.

The illumination beam emitted by laser die 104 is collimated by a ball lens 134, which is positioned in a groove 135 formed in SiOB 102. Groove 135 may be produced in silicon (and other semiconductor materials) with lithographic precision by techniques that are known in the art, such as wet etching. Alternatively or additionally, the ball lens may be attached directly to SiOB by an accurate pick-and-place machine, even without groove 135. A turning mirror 136 reflects the collimated beam away from SiOB 102 and through a cover glass 137, which protects the optoelectronic components in module 130. As ball lens 134 typically achieves only partial collimation, a beam expander 138 may be used to expand the laser beam, typically by a factor of three to ten, and thus enhance its collimation. Although beam expander 138 is shown here as a single-element optical component, multi-element beam expanders may alternatively be used. The design of module 130 is advantageous in that it can be assembled accurately without requiring active alignment, i.e., assembly and alignment can be completed to within fine tolerance without actually powering on laser die 104.

The collimated beam that is output by beam expander 138 is turned by a reflector 144 in beam combiner 142, and is then turned back outward toward the scanning mirror by a beamsplitter 146. Assuming laser die 104 to output a polarized beam, beamsplitter 146 may advantageously be polarization-dependent, as explained above with reference to FIG. 7. The collected beam returned from the scanning mirror passes through beamsplitter 146 and is then focused onto APD 114 by a collection lens 140. The collection lens may have an asymmetrical, elongated shape, as shown in FIGS. 8A and 8B, in order to maximize light collection efficiency within the geometrical constraints of module 130.

Although beam combiner 142 is shown in FIG. 8B as a single prismatic element, other implementations may alternatively be used. For example, the beam combining function may be performed by two separate angled plates: a reflecting plate in place of reflector 144 and a beamsplitting plate in place of beamsplitter 146.

Figure 9:
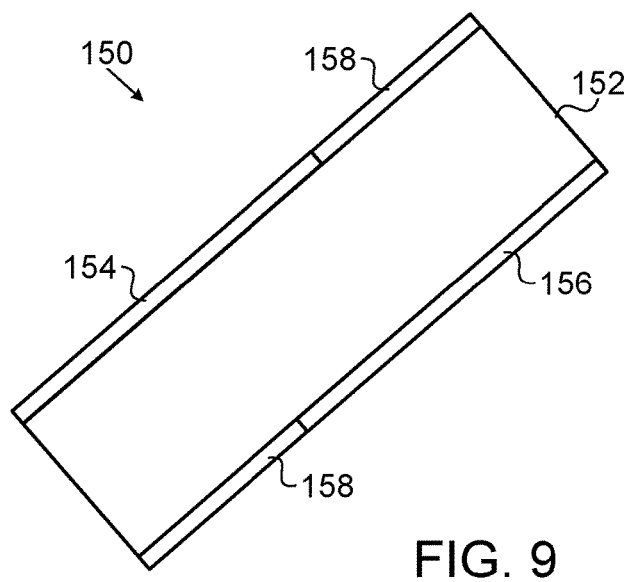
FIG. 9 is a schematic side view of a beam combiner, in accordance with an embodiment of the present invention.

FIG. 9 is a schematic side view of a beam combiner 150, which can be used in place of beam combiner 142 in accordance with another embodiment of the present invention. Beam combiner 150 comprises a transparent substrate 152, made of glass, for example, with a reflective coating 154, taking the place of reflector 144, and a beamsplitting coating 156 (typically polarization-dependent), taking the place of beamsplitter 146. An anti-reflection coating 158 may be applied to the remaining areas of the front and rear surfaces of substrate 152, through which the projected and collected beams enter and exit combiner 150. The design of beam combiner 150 is advantageous in terms of simplicity of manufacture and assembly.

Figure 10A:
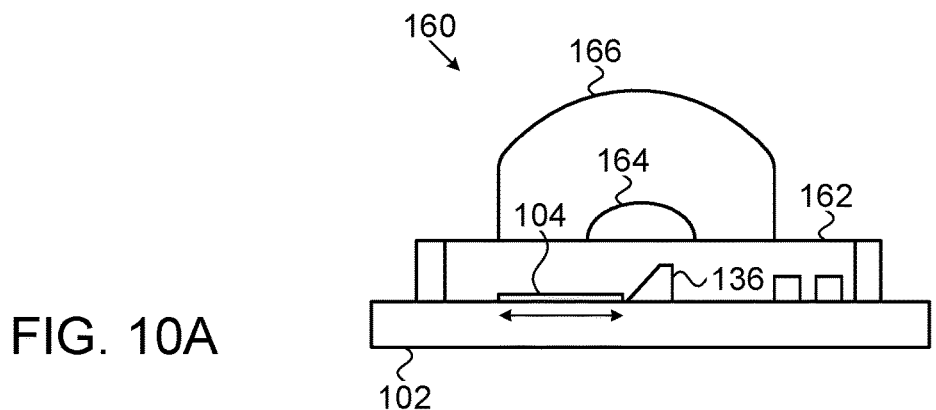
FIGS. 10A and 10B are schematic side views of an optoelectronic module, in accordance with still another embodiment of the present invention.
Figure 10B:
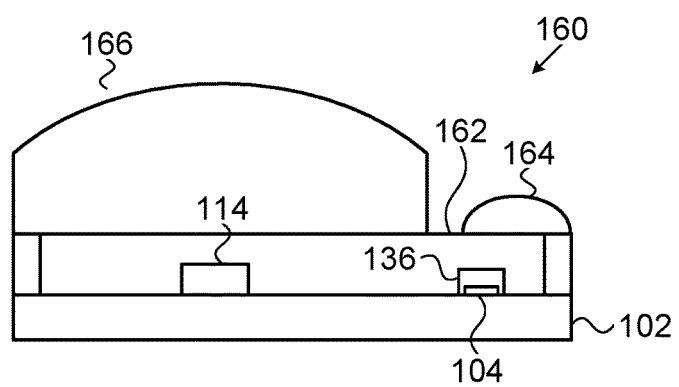

FIGS. 10A and 10B are schematic side views of an optoelectronic module 160, in accordance with a further embodiment of the present invention. The two views are rotated 90° relative to one another, such that elements at the front of FIG. 10A are seen at the right side in FIG. 10B. The principles of the design and operation of module 160 are similar to those of module 130 (FIGS. 8A/B), except that no ball lens is used for collimation in module 160. A collimation lens 164 for the beam that is transmitted from laser die 104 and a collection lens 166 for the beam that is received from the scanning mirror are mounted in this case directly on a cover glass 162 of the module. The beam axes of the transmitted and received beams are typically aligned by a beam combiner (not shown in these figures), as in the embodiment of FIGS. 8A/B.

If lenses 164 and 166 have tight manufacturing tolerances, they can be assembled in place using machine vision techniques to align their optical centers with the appropriate axes of module 160, on top of cover glass 162. Such miniature lenses, however, typically have large manufacturing tolerances, commonly on the order of 1-5%, particularly when the lenses are mass-produced in a wafer-scale process. Such tolerance could, if not measured and accounted for, result in poor collimation of the beam from laser die 104.

To avoid this sort of situation, the actual effective focal length (EFL) of collimation lens 164 can be measured in advance. For example, when lenses 164 are fabricated in a wafer-scale process, the EFL of each lens can be measured precisely at the wafer level, before module 160 is assembled. The distance of laser die 104 from turning mirror 136 on the substrate in each module 160 can then be adjusted at the time of fabrication, as illustrated by the horizontal arrow in FIG. 10A, to match the measured EFL of the corresponding lens 164. The laser die is then fixed (typically by glue or solder) in the proper location. This adjustment of the location of the laser die is well within the capabilities of existing pick-and-place machines, which may similarly be used to center lens 164 accurately on cover glass 162 above turning mirror 136. As a result, the components of module can be assembled and aligned without actually powering on and operating laser die 114, i.e., no "active alignment" is required.

A pick-and-place machine may similarly be used to position collection lens 166. Because of the less stringent geometrical constraints of the collected beam and the relatively large size of APD 114, however, EFL variations of the collection lens are less critical. Thus, as an alternative to mounting collection lens 166 on cover glass 162 as shown in FIGS. 10A and B, the collection lens may be assembled onto module 160 after fabrication, together with the beam combiner.

Alternatively, as noted earlier, modules based on the principles of the embodiments described above may be fabricated on other sorts of micro-optical substrates, such as ceramic or glass substrates. Ceramic materials may be advantageous in terms of electrical performance.

In other alternative embodiments (not shown in the figures), the transmitting and receiving portions of the optoelectronic module may be mounted separately on two different micro-optical benches. This approach may be advantageous since the requirements for the receiver are high bandwidth, low loss for high-frequency signals, and low price, while for the transmitter the main requirement are thermal conductivity, as well as hermetic sealing for reliability of the laser diode.

Beam Transmitters and Modules Based on Surface Emitters

Figure 11A:
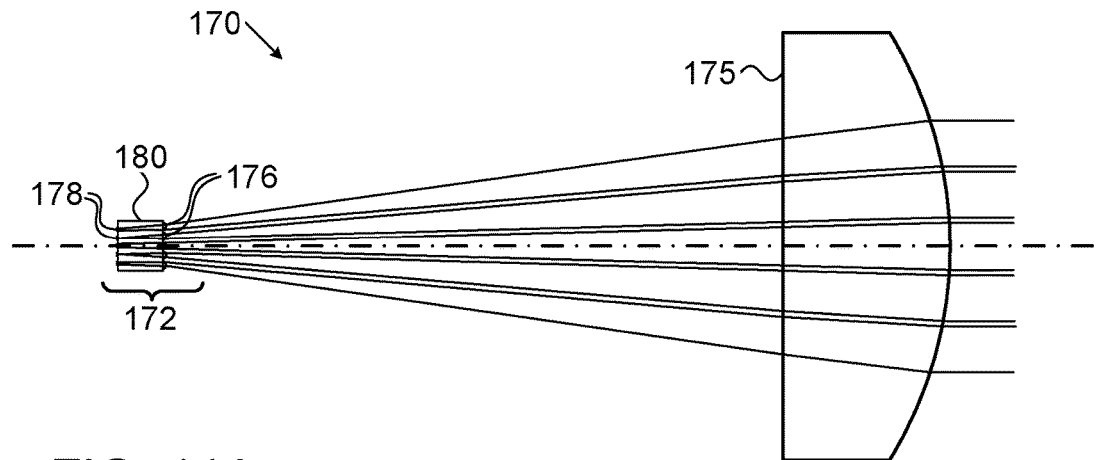
FIG. 11A is a schematic side view of a beam transmitter, in accordance with an embodiment of the present invention.
Figure 11B:
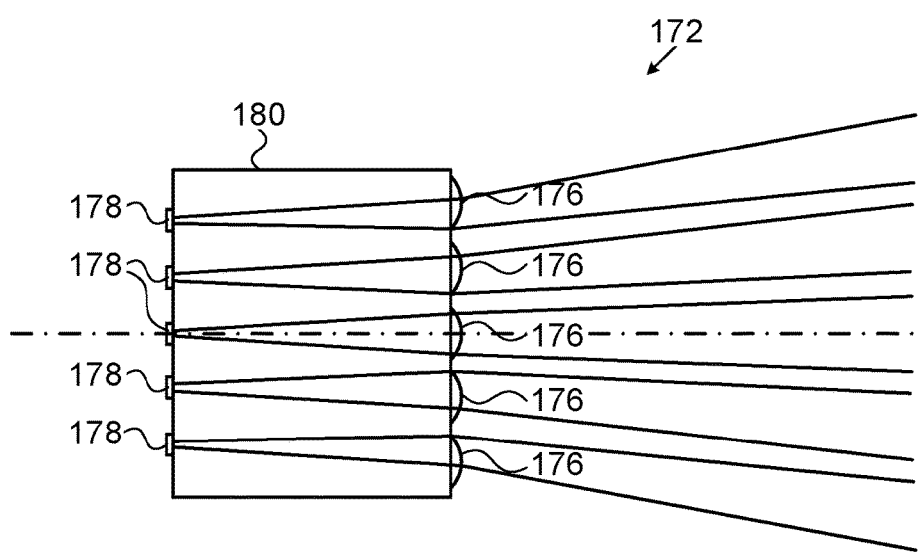
FIGS. 11B and 11C are schematic side and rear views, respectively, of a beam generator, in accordance with an embodiment of the present invention.
Figure 11C:
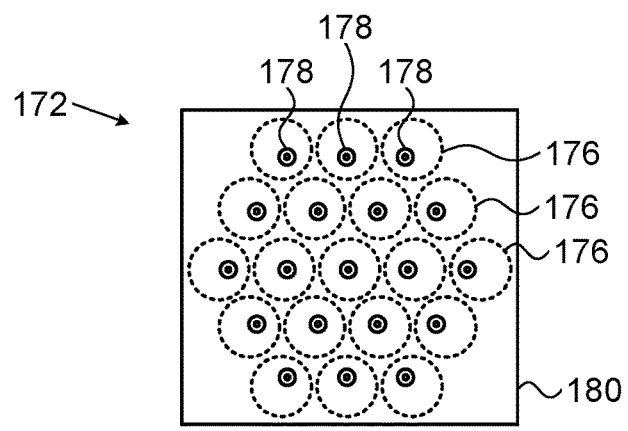

Reference is now made to FIGS. 11A-C, which schematically illustrate a beam transmitter 170, in accordance with an embodiment of the present invention. FIG. 11A is a side view of the entire beam transmitter, while FIGS. 11B and 11C are side and rear views, respectively, of a beam generator 172 that is used in transmitter 170. Transmitter 170 is suited particularly for use in optoelectronic modules that may be integrated in an optical scanning head of the type described above, and modules of this sort are described further hereinbelow. Transmitters of this type, however, may also be used in other applications in which a compact source is required to generate an intense, well-controlled output beam.

Beam generator 172 comprises an array of surface-emitting devices 178, such as vertical-cavity surface-emitting lasers (VCSELs). The beams emitted by devices 178 are collected by a corresponding array of microlenses 176, which direct the beams toward a collimation lens 175. Devices 178 and microlenses 176 may conveniently be formed on opposing faces of a transparent optical substrate 180, such as a suitable semiconductor wafer, such as a GaAs wafer. (GaAs has an optical passband that begins at about 900 nm, i.e., it is transparent at wavelengths longer than about 900 nm, and will thus pass the radiation at such wavelengths that is emitted by devices 178 on the back side of substrate 180.) The thickness of substrate 180 is typically about 0.5 mm, although smaller or larger dimensions may alternatively be used. As shown most clearly in FIG. 11C, the locations of devices 178 are offset inwardly relative to the centers of the corresponding microlenses 176, thus giving rise to an angular spread between the individual beams transmitted by the microlenses.

Figure 11D:
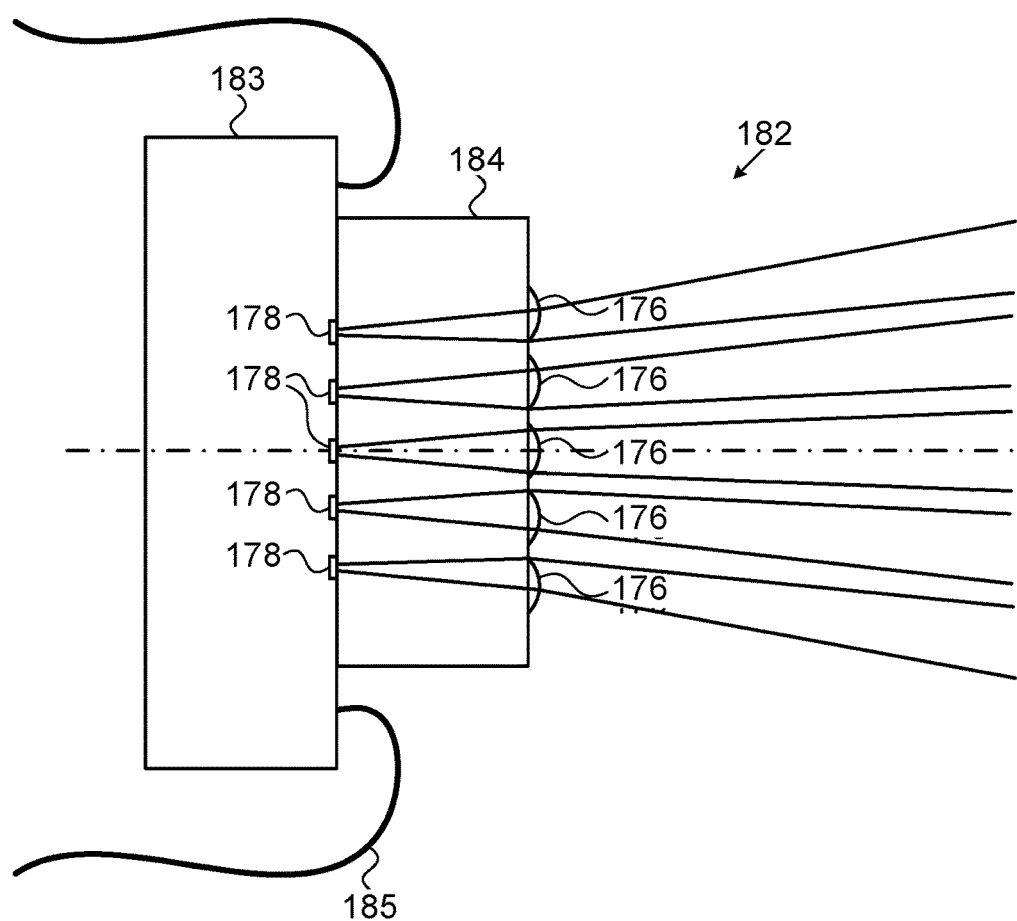
FIG. 11D is a schematic side view of a beam generator, in accordance with an alternative embodiment of the present invention.

FIG. 11D is a schematic side view of a beam generator 182, in accordance with an alternative embodiment of the present invention. In this embodiment, surface emitting devices 178 are formed on the front side of a substrate 183, which may be connected to an underlying substrate by wire bonds 185. Microlenses 176 are formed on a separate transparent blank 184, such as a glass blank, which is then aligned with and glued over devices 178 on substrate 183. The design of beam generator 182 is thus appropriate when devices 178 are designed to emit at shorter wavelengths, to which the substrate is not transparent. For reasons of optical design and heat dissipation, substrate 183 and blank 184 are each typically about 0.25 mm thick, although other dimensions may similarly be used.

Figure 12A:
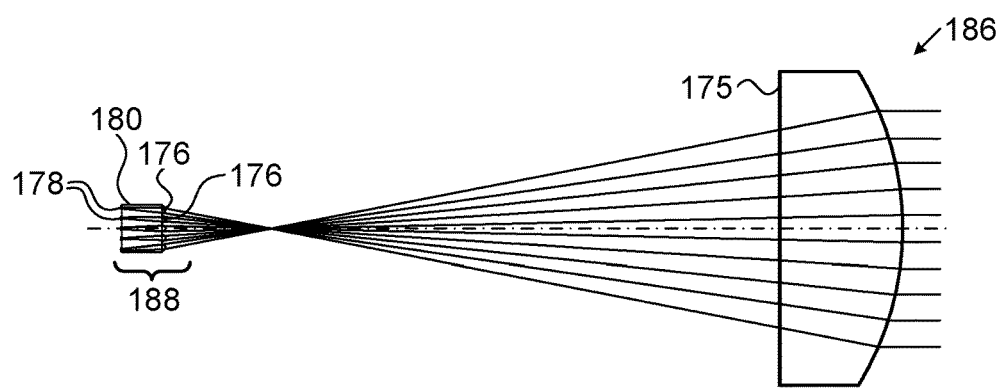
FIG. 12A is a schematic side view of a beam transmitter, in accordance with another embodiment of the present invention.
Figure 12B:
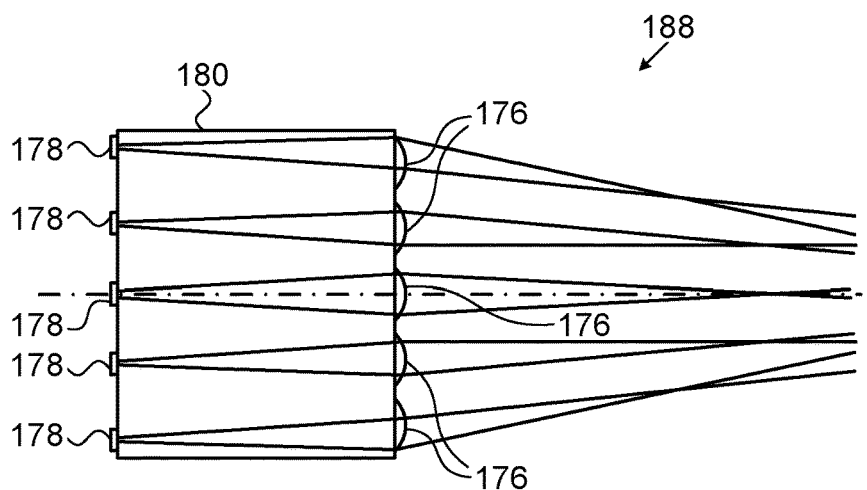
FIGS. 12B and 12C are schematic side and rear views, respectively, of a beam generator, in accordance with another embodiment of the present invention.
Figure 12C:
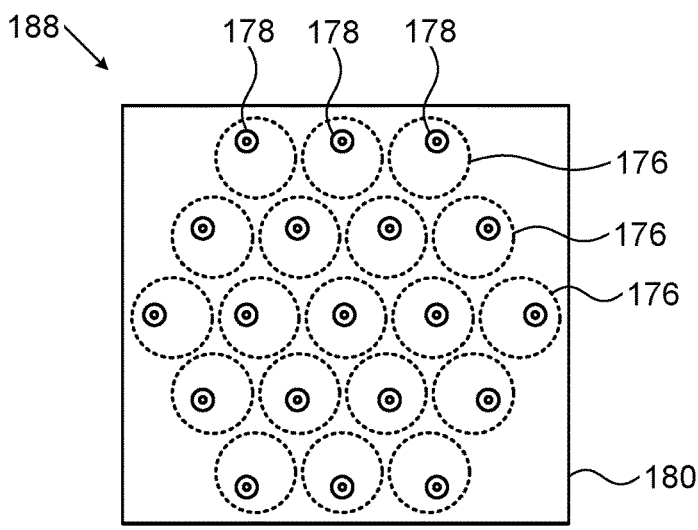

FIGS. 12A-C schematically illustrate a beam transmitter 186, in accordance with another embodiment of the present invention. Again, FIG. 12A is a schematic side view of the entire beam transmitter, while FIGS. 12B and 12C are schematic side and rear views, respectively, of a beam generator 188 that is used in transmitter 186. Beam generator 188 differs from beam generator 172 in that the locations of devices 178 in beam generator 188 are offset outwardly relative to the centers of the corresponding microlenses 176, as shown in FIG. 12C. As a result, the individual beams transmitted by microlenses 176 converge to a focal waist, before again spreading apart, as shown in FIG. 12A.

Surface-emitting devices 178 in beam transmitters 170 and 186 may be driven individually or in predefined groups in order to change the characteristics of the beam that is output by lens 175. For example, all of devices 178 may be driven together to give a large-diameter, intense beam, or only the center device alone or the central group of seven devices together may be driven to give smaller-diameter, less intense beams. Although FIGS. 11C and 12C show a particular hexagonal arrangement of the array of surface-emitting devices, other arrangements, with larger or smaller numbers of devices, in hexagonal or other sorts of geometrical arrangements, may alternatively be used.

Figure 13:
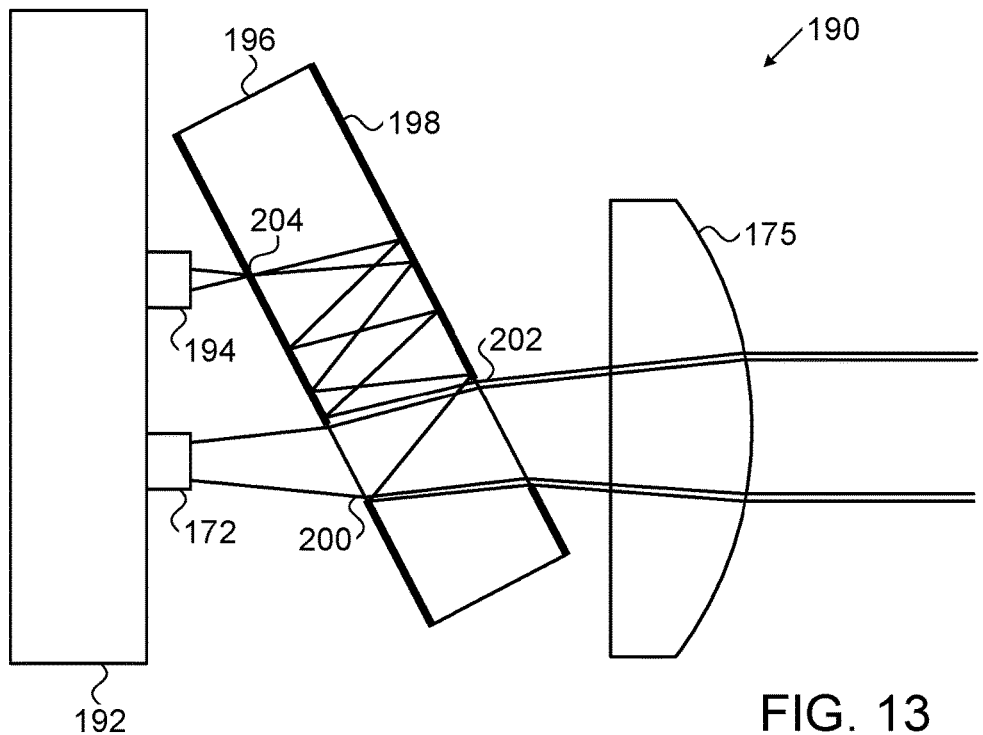
FIGS. 13-15 are schematic side views of optoelectronic modules, in accordance with further embodiments of the present invention.
Figure 14:
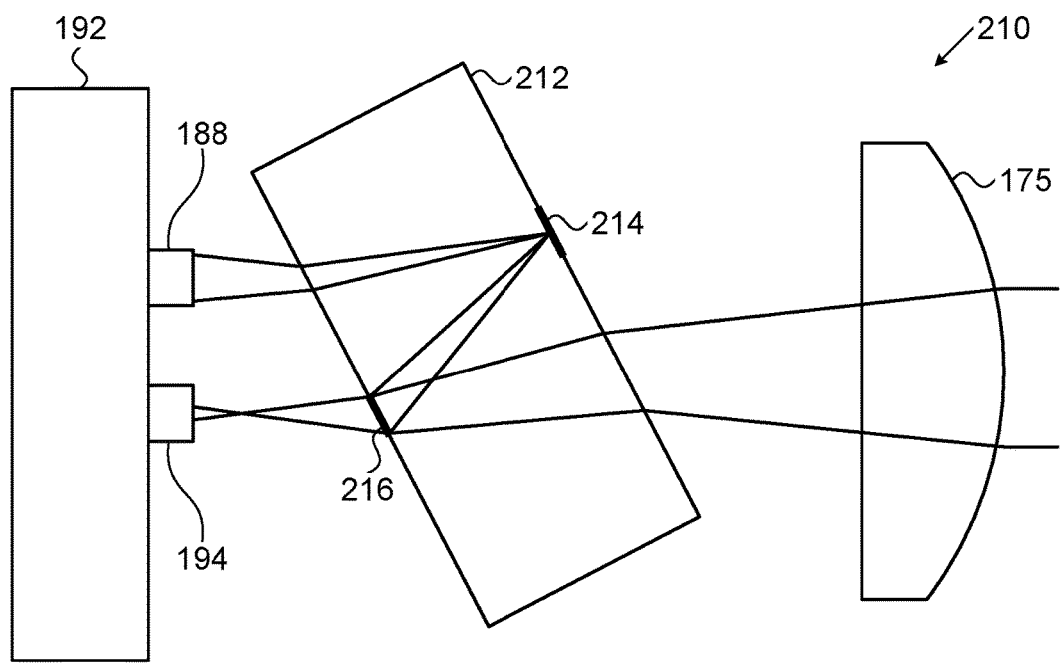
Figure 15:
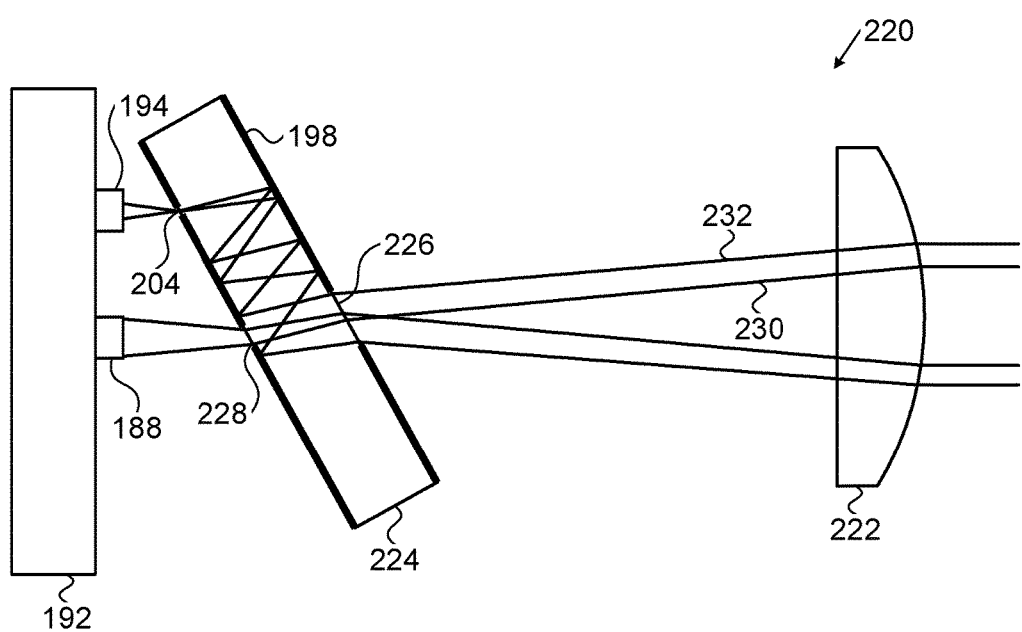

FIG. 13 is a schematic side view of an optoelectronic module 190 that incorporates beam generator 172 (FIGS. 11B/C), in accordance with an embodiment of the present invention. This module, as well as the alternative modules that are shown in FIGS. 14 and 15, may be used in conjunction with a scanning mirror and other components in producing the sorts of optical scanning heads that are described above. The modules of FIGS. 13-15 may alternatively be used in other applications requiring a compact optical transmitter and receiver with coaxial transmitted and received beams.

In module 190, beam generator 172 (as illustrated in FIGS. 11B/C) is mounted on a micro-optical substrate 192, such as a SiOB, along with a receiver 194, which contains a suitable detector, such as an APD, for example, as described above. A beam combiner 196 combines the transmitted and received beams, which pass through lens 175 toward the scanning mirror (not shown in FIGS. 13-15). Beam combiner 196 in this embodiment comprises a glass plate, with an external reflective coating 198 over most of its surface, other than where the transmitted and reflected beams enter and exit the plate. The beam transmitted by beam generator 172 enters the beam combiner through a beamsplitter coating 200, which may be polarization-dependent, as explained above, and exits through a front window 202, which may be anti-reflection coated.

The received beam collected by lens 175 enters beam combiner 196 through window 202, reflects internally from beamsplitter coating 200 and reflective coating 198, and then exits through a rear window 204 toward receiver 194. The thickness of the beam combiner plate is chosen to give the desired optical path length (which is longer than the back focal length of lens 175 would be otherwise). To reduce the amount of stray light reaching the receiver, window 204 may be located at the focus of lens 175 and thus can be made as small as possible. Window 204 (as well as window 202) may have a narrowband filter coating, so that ambient light that is outside the emission band of beam generator 172 is excluded.

FIG. 14 is a schematic side view of an optoelectronic module 210 that incorporates beam generator 188 (FIGS. 12B/C), in accordance with another embodiment of the present invention. A beam combiner 212 in this case comprises a glass plate with a reflective coating 214 to fold the beam transmitted by beam generator 188 and a beamsplitter coating 216 where the transmitted and received beams are combined at the rear surface of the glass plate. Beamsplitter coating 216 may also be overlaid or otherwise combined with a narrowband filter on the path to receiver 194, as in the preceding embodiment. The thickness of beam combiner 212 in this embodiment is chosen to give the desired path length of the beam transmitted by beam generator 188, which has a focal waist inside the beam combiner.

Although in FIG. 14 the transmitted and received beams have roughly equal apertures, the aperture of the transmitted beam may alternatively be made smaller than that of the received beam. In this latter case, the diameter of beamsplitter coating 216 need be no larger than the transmitted beam aperture. Outside this aperture, the glass plate may have a reflective coating, so that the received beam can reach receiver 194 without loss of energy due to the beamsplitter.

FIG. 15 is a schematic side view of an optoelectronic module 220 that incorporates beam generator 188, in accordance with yet another embodiment of the present invention. In this embodiment, a bifocal lens 220 has a central zone that collects and collimates a beam 230 transmitted by beam generator 188, with a relatively small aperture and a short focal length. The peripheral zone of lens 220 collects and focuses a beam 232 onto receiver 194 with a larger aperture and longer focal length. Thus, the area of lens 220, and concomitantly the area of the scanning mirror, is divided into a small, central transmit zone and a larger, surrounding receive zone.

A beam combiner 224 used in this embodiment has a front window 226 that is large enough to accommodate beam 232, but a much smaller window 228 in reflective coating 198 on the rear side. Window 228 need only be large enough to accommodate the narrow beam transmitted by beam generator 188. Consequently, most of the energy in beam 232 is reflected inside the beam combiner by reflective coating 198 and reaches receiver 194 via rear window 204 (which may be made small and coated with a narrowband coating, as described above). There is no need for a beamsplitter coating in this embodiment, and beam generator 188 may therefore comprise unpolarized, multimode surface-emitting devices.

Alternative Embodiments

Although the embodiments described above use a single detector element (such as an APD) to detect scanned light that is returned from the scene, other sorts of detector configurations may alternatively be used. For example, a linear array of photodetectors may be used for this purpose, in which case the mirror used in collecting light from the scene need scan in only a single direction, perpendicular to the axis of the array. This same one-dimensional scanning mirror can be used to project a line of laser radiation onto the instantaneous field of view of the detector array. Such a system is also capable of zoom functionality, which can be achieved on one axis by changing the scan pattern and amplitude along the one-dimensional scan.

As another alternative, a 2D matrix of photodetectors with a stationary collection lens may be used to collect scanned light from the scene, covering the entire field of view so that no mechanical scanning of the receiver is needed. The transmitting laser is still scanned in two dimensions using a MEMS mirror, for example. The pixel positions in the resulting depth map are determined by the high precision of the scan, rather than the relatively lower resolution of the detector matrix. This approach has the advantages that alignment is easy (since the detector matrix is stationary); the scanning mirror can be small since it is not used to collect light, only to project the laser; and the collection aperture can be large. For example, using a collection lens of 6 mm focal length and detectors with a pitch of 0.1 mm, the field of view of each detector is approximately 1°. Thus, 60×60 detectors are needed for a 60° field of view. The resolution, as determined by the scan accuracy, however, can reach 1000×1000 points.

Another variant of this scheme may use multiple beams (created, for example, by a beamsplitter in the optical path of the transmitted beam after it reflects from the MEMS mirror). These beams create simultaneous readings on different detectors in the matrix, thus enabling simultaneous acquisition of several depth regions and points. It is desirable for this purpose that the beams themselves not overlap and be far enough apart in angular space so as not to overlap on any single element of the matrix.

More generally, although each of the different optoelectronic modules and other system components described above has certain particular features, this description is not meant to limit the particular features to the specific embodiments with respect to which the features are described. Those skilled in the art will be capable of combining features from two or more of the above embodiments in order to create other systems and modules with different combinations of the features described above. All such combinations are considered to be within the scope of the present invention.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. Mapping apparatus, comprising:
   a transmitter, which is configured to emit at least one beam comprising a sequence of pulses of light toward a plurality of points in a scene;
   a receiver, which is configured to receive the light reflected from the scene and to generate an output indicative of a time of flight of the pulses to and from the points in the scene; and
   a processor, which is coupled to process the output of the receiver so as to generate a 3D map of the scene, while controlling a power level of the pulses emitted by the transmitter toward each point among the plurality of points in the scene responsively to a level of the output from the receiver in response to one or more previous pulses that were transmitted toward the same point in the scene so as to reduce variations in an intensity of the reflected light that is received from different parts of the scene.

2. The apparatus according to claim 1, wherein the one or more previous pulses comprise scout pulses emitted by the transmitter in order to assess and adjust the power level.

3. The apparatus according to claim 2, wherein the power level of the scout pulses transmitted toward at least some of the points in the scene is lower than the power level of the pulses transmitted toward the at least some of the points in order to generate the output indicative of the time of flight.

4. The apparatus according to claim 1, wherein the transmitter comprises a laser.

5. The apparatus according to claim 1, and comprising a scanner, which is configured to scan the at least one beam over the plurality of the points in the scene, so that the pulses are incident on successive, neighboring points along a scan path.

6. The apparatus according to claim 5, wherein the processor is configured to set the power level at each of the plurality of points based on the level of the output due to a previous pulse that was transmitted toward a different, preceding point on the scan path.

7. The apparatus according to claim 5, wherein the receiver comprises a detector, which is configured to receive the light reflected from the scene via the scanner.

8. The apparatus according to claim 7, and comprising a beamsplitter, which is positioned so as to direct the at least one beam emitted by the transmitter toward the scanner, while permitting the reflected light to reach the detector, wherein the at least one emitted beam and the reflected light have respective optical axes, which are parallel between the beamsplitter and the scanner.

9. The apparatus according to claim 5, wherein the processor is coupled to control the scanner so as to cause the at least one beam to scan over a selected window within the scan range and to process the output of the receiver so as to generate the 3D map of a part of the scene that is within the selected window.

10. The apparatus according to claim 9, wherein the processor is configured to select a different window to scan in each scan of the at least one beam.

11. The apparatus according to claim 1, wherein the receiver comprises a two-dimensional matrix of photodetectors with a stationary collection lens.

12. The apparatus according to claim 1, wherein the at least one beam comprises multiple beams emitted simultaneously by the transmitter.

13. A method for mapping, comprising:
   directing at least one beam comprising a sequence of pulses of light emitted by a transmitter toward a plurality of points in a scene;
   receiving the light reflected from the scene and generating an output indicative of a time of flight of the pulses to and from the points in the scene;
   processing the output so as to generate a 3D map of the scene; and
   controlling a power level of the pulses emitted by the transmitter toward each point among the plurality of points in the scene responsively to a level of the output from the receiver in response to one or more previous pulses that were transmitted toward the same point in the scene so as to reduce variations in an intensity of the reflected light that is received from different parts of the scene.

14. The method according to claim 13, wherein the one or more previous pulses comprise scout pulses emitted in order to assess and adjust the power level.

15. The method according to claim 14, wherein the power level of the scout pulses transmitted toward at least some of the points in the scene is lower than the power level of the pulses transmitted toward the at least some of the points in order to generate the output indicative of the time of flight.

16. The method according to claim 13, wherein directing the at least one beam comprises the at least one beam over the plurality of the points in the scene, so that the pulses are incident on successive, neighboring points along a scan path, and wherein controlling the power level comprises setting the power level at each of the plurality of points based on the level of the output due to a previous pulse that was transmitted toward a different, preceding point on the scan path.

\* \* \* \* \*